Figure 1:
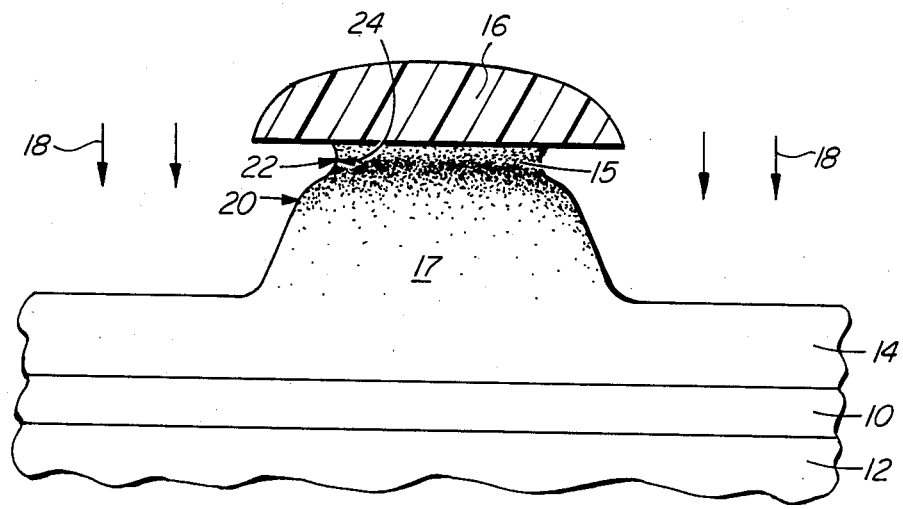

United States Patent [19]

Abraham et al.

[11] Patent Number: 4,718,973
[45] Date of Patent: Jan. 12, 1988

[54] PROCESS FOR PLASMA ETCHING POLYSILICON TO PRODUCE ROUNDED PROFILE ISLANDS

[75] Inventors: Thomas Abraham, Kanata; Robert E. Theriault, Ottawa, both of Canada

[73] Assignee: Northern Telecom Limited, Montreal, Canada

[21] Appl. No.: 864,668

[22] Filed: May 19, 1986

[30] Foreign Application Priority Data

Jan. 28, 1986 [CA] Canada .................................. 500503

[51] Int. Cl.[4] ........................................... H01L 21/308
[52] U.S. Cl. .................................... 156/628; 156/643; 156/646; 156/657; 156/659.1; 156/662; 437/233; 437/249; 437/981
[58] Field of Search ............... 156/628, 643, 646, 657, 156/659.1, 662; 148/189, DIG. 42, DIG. 53; 29/580; 437/233, 249, 981

[56] References Cited

U.S. PATENT DOCUMENTS

3,892,606  7/1975  Chappelow et al. ............... 148/174
4,473,435  9/1984  Zafiropoulo et al. ............... 156/643
4,554,728  11/1985  Shepard .......................... 156/628 X

FOREIGN PATENT DOCUMENTS

59-23522    2/1984  Japan .................................. 156/628
59-141232   8/1984  Japan .......................... 148/DIG. 42
59-232443  12/1984  Japan .......................... 148/DIG. 42

OTHER PUBLICATIONS

Adler, "Combined Shallow and Deep Junction Self-Aligned MOSFET Process", IBM TDB, vol. 24, No. 8, Jan. 1982, pp. 4186-4187.

Primary Examiner—S. Leon Bashore
Assistant Examiner—Andrew J. Anderson
Attorney, Agent, or Firm—S. Wilkinson

[57] ABSTRACT

In a silicon integrated circuit manufacturing process a layer of polysilicon is ion implanted with an n-type dopant and etched through a mask with a fluorine:chlorine mixture. The etchant undercuts at the mask to an extent dependent on the ratio of chlorine:fluorine and on the dopant level. By appropriately selecting that ratio and dopant level, polysilicon islands having a rounded profile can be achieved, this being most efficacious for subsequent deposition onto the polysilicon.

11 Claims, 2 Drawing Figures

U.S. Patent  Jan. 12, 1988  4,718,973

PROCESS FOR PLASMA ETCHING POLYSILICON TO PRODUCE ROUNDED PROFILE ISLANDS

This invention relates to a silicon integrated circuit fabrication technique and specifically to a method for plasma etching polysilicon so as to obtain polysilicon islands having a rounded profile.

Plasma etching is the accepted technique for patterning polysilicon gate material in MOS device fabrication. The impetus for this has been an enhanced dimensional control using dry etching. In general, fluorinated and/or chlorinated gases are used with the former resulting in isotropic etching and the latter in anisotropic etching with vertical slopes. Several processes use a combination of the two for higher etch rates and improved oxide selectivities.

While anisotropic etching gives good dimensional control, the steep 90° slopes or in some cases re-entrant profiles can cause problems with step coverage. This is especially true in double metal structures where metal lines in close proximity to sharp polysilicon lines can result in deep grooves being formed during planarization of inter-metal dielectric.

As indicated above the result generally of etching with chlorinated gases such as $CCl_4$ is anisotropic etch slopes with little or no undercut. It is also known that chlorinated gas systems tend to show a strong etch rate dependence on n-type doping and that the etch rate increases if the doped polysilicon is thermally annealed (C. J. Mogab et al, J. Vac. Sci. Technology, Vol 17(3), p721, 1980; J. W. Coburn et al, J.Vac. Sci Technology, Vol. 16(2), p391, 1979; A. C. Adams et al, J. Electrochem. Soc., Vol. 138, 2, p366, 1981.

According to the invention, there is provided in a silicon integrated circuit fabrication process the steps of depositing a layer of polysilicon, implanting an n-type dopant within said polysilicon layer so that the dopant is heavily concentrated at the polysilicon surface, and plasma etching through a mask using an etchant producing a mixture of fluorine and chlorine to form islands of polysilicon, wherein the n-type dopant concentration profile and the ratio of fluorine:chlorine is selected to produce a rounded upper outer edge profile in said polysilicon islands.

The upper outer edge profile can be enhanced by further forming a thin oxide layer between said polysilicon and the mask before implanting n-type dopant and then removing the oxide layer together with the mask before plasma etching.

The degree of etching and in particular the extent of undercutting in the plasma etch process is a function of dopant concentration through the polysilicon layer. The fluorine:chlorine etchant gas more effectively etches the n-type doped polysilicon if the dopant is activated, as by annealing.

The implantation process ensures that the dopant concentration is at a maximum near an upper surface of the polysilicon and decreases with depth in the polysilicon layer. Suitable n-type dopants are phosphorus and arsenic. The free chlorine and fluorine can be derived respectively from a mixture of $C_2ClF_5$ and $SF_6$.

The polysilicon islands obtained are especially adapted for use as device field effect transistor (FET) gates.

The silicon integrated circuit process can further comprise forming a first gate layer oxide prior to deposition of the polysilicon and thermally growing a second gate oxide layer after exposing the polysilicon islands by removal of the mask. Subsequently a dielectric layer such as low pressure chemically vapour deposited boron doped phosphosilicate glass can be deposited over the second gate oxide layer, the LPCVD glass having smooth upper contour conforming to the rounded upper edge profile of the polysilicon islands.

Figure 2:
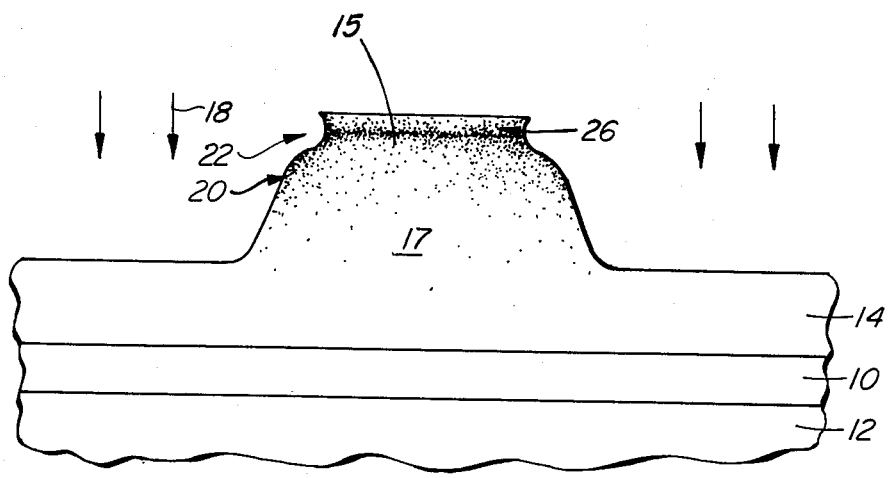

Embodiments of the invention will now be described by way of example with reference to the accompanying drawings in which:

FIG. 1 is a cross-sectional view through part of a silicon integrated circuit fabricated using a process according to the invention; and FIG. 2 is a figure corresponding to FIG. 1 but using a modification of the process.

A layer of silicon dioxide 10 is thermally grown on a silicon substrate 12 and the oxide is then coated with a 0.5 μm thick layer 14 of chemically vapour deposited polysilicon. The polysilicon 14 is implanted 15 with phosphorus using a dose of $2 \times 10^{16} cm^{-2}$ at 60 KeV. A photoresist mask 16 is formed over the polysilicon 14 and the exposed polysilicon is subjected to plasma etching 18 in a parallel plate plasma etching system (not shown) with an etchant consisting of a mixture of $C_2ClF_5$ and $SF_6$ using a 13.56 MHz RF generator.

The $C_2ClF_5$ and $SF_6$ dissociates respectively to form free chlorine and free fluorine. The chlorine to fluorine ratio can be varied by changing the $C_2ClF_5$ to $SF_6$ flow rate ratios.

Other n-type dopants such as arsenic can also be implanted. When etched with $SF_6$:$C_2ClF_5$ (1:1), polysilicon islands 17 are obtained with rounded upper edge profile 20 as shown in FIG. 1. The edge profile 20 is completely different to that obtained when using conventional plasma etching methods in which polysilicon is uniformly phosphorus doped throughout its width by diffusion from a $POCl_3$ source. As shown in FIG. 1, the profile is relatively straight at the base of the layer but rounds off towards the top with a significant degree of undercut 22. At the extreme top of the profile there is a notched step 24 with a slight re-entrant slope.

The lateral undercut 22 increases when the implant dose is increased indicating that the undercut is caused by dopant dependent lateral etching of the top layer of polysilicon. The vertical etch rate shows a strong dependence on polysilicon depth, decreasing in value as the film is etched. In fact the etched edge profile shows appreciable correlation with the initially implanted doping profile.

Generally, the greater the relative amount of free chlorine in a chlorine:fluorine etchant gas mixture, the more the edge profile tends towards the n-type dopant concentration profile. However, it is beneficial to maintain fluorine in the etchant gas mixture to ensure a rapid etch. Moreover, although with high chlorine content there is appreciable undercutting and associated shaping of the polysilicon islands to give rounded upper edges 20, the chlorine content and etch interval should not be so great as to strip the polysilicon of the highly n-doped surface layer. If the surface layer is lost, then the sheet resistance of the polysilicon, even after thermal drive-in of the remaining n-type dopant, is high and the polysilicon islands 17 are not adapted for use as an FET gate.

The etch rate is also a function of dopant activation. Thus although there is some dopant activation during the implant doping process, the etch rate can be increased by annealing the doped polysilicon at 600° C., this having the effect of activating the dopant without driving it into the polysilicon. At higher anneal temperatures such as 900° C. the dopant is re-distributed through the film and the rounded profile cannot be achieved.

As indicated previously the value of the controlled undercut 22 is that it produces a rounded upper edge profile 20 of the polysilicon islands 17. The rounded profile enhances subsequent step coverage of a further gate oxide layer (not shown) formed on the polysilicon. Thus when 7% phosphosilicate glass is low pressure chemically vapour deposited on the gate oxide, a glass layer characterized by a smoothly curving surface results.

The re-entrant step 24 is caused by an increase in dopant concentration from the top of the layer to a position about 1,000 Angstroms into the polysilicon film. Thus the bottom of the re-entrant step corresponds essentially to the peak of the doping profile. The top notch 24 has little or no adverse effect on subsequent step coverage but that effect can be obviated by modifying the process. Thus with reference to FIG. 2 in which like features have numerals corresponding to those of FIG. 1, before the introduction of dopant in the polysilicon, the polysilicon 14 is covered by a 200 Angstrom thick thermally grown oxide layer 26. In this modified process, the dopant concentration reaches a maximum concentration first below the oxide layer 26, i.e. at a distance of the order of 200 Angstroms from the surface at which the ions are incident. Consequently, that maximum coincides with the top surface of the polysilicon. When the oxide 26 is removed, the dopant concentration and, subsequently, the etched edge have the rounded profile shown. The polysilicon is devoid of any notch or re-entrant part at the polysilicon surface.

What is claimed is:

1. In a silicon integrated circuit fabrication process the steps in order of:
   depositing a layer of polysilicon;
   forming a thin oxide layer on said polysilicon;
   implanting an n-type dopant within said polysilicon layer so that the dopant is heavily concentrated at the polysilicon surface;
   removing the oxide layer; and
   plasma etching through a mask to form islands of polysilicon wherein the n-type dopant concentration profile is selected to produce a rounded upper outer edge profile in said polysilicon islands.

2. A process as claimed in claim 1 in which an etchant gas used to plasma etch the polysilicon contains fluorine and chlorine.

3. A process as claimed in claim 2 wherein the fluorine is derived from $SF_6$.

4. A process as claimed in claim 2 in which the chlorine is derived from $C_2ClF_5$.

5. A process as claimed in claim 2 in which the fluorine and the chlorine are produced from a gas etchant mixture of $SF_6$ and $C_2ClF_5$.

6. A process as claimed in claim 2 further comprising tailoring the profile by selecting a flow rate ratio of fluorine to chlorine in the range from 1:1 to 1:9.

7. A process as claimed in claim 1 further comprising thermally annealing the polysilicon after introduction of dopant and prior to plasma etching.

8. A process as claimed in claim 1 in which the dopant concentration is a maximum at an upper surface of the polysilicon and decreases as a function of depth within the polysilicon layer.

9. A process as claimed in claim 1 in which the n-type dopant is one of the group consisting of phosphorus and arsenic.

10. A process as claimed in claim 1 further comprising thermally growing an oxide layer on a silicon substrate prior to deposition of said polysilicon layer and thermally growing a second gate oxide layer on the polysilicon islands after exposure thereof by removal of the mask.

11. A process as claimed in claim 10 further comprising low pressure chemical vapour depositing a layer of dielectric over the second oxide layer said dielectric having an upper surface characterized by smoothly curving regions conforming to the rounded upper edge profile of said polysilicon islands.

* * * * *